(12) United States Patent
Penny et al.

(10) Patent No.: US 11,373,880 B2
(45) Date of Patent: Jun. 28, 2022

(54) CREATING DIFFERENT WIDTH LINES AND SPACES IN A METAL LAYER

(71) Applicant: International Business Machines Corporation, Armonk, NY (US)

(72) Inventors: Christopher J Penny, Saratoga Springs, NY (US); Ekmini Anuja De Silva, Slingerlands, NY (US); Ashim Dutta, Menands, NY (US); Abraham Arceo de la Pena, Albany, NY (US)

(73) Assignee: International Business Machines Corporation, New York, NY (US)

( * ) Notice: Subject to any disclaimer, the term of this patent is extended or adjusted under 35 U.S.C. 154(b) by 129 days.

(21) Appl. No.: 17/028,317

(22) Filed: Sep. 22, 2020

(65) Prior Publication Data

US 2022/0093414 A1   Mar. 24, 2022

(51) Int. Cl.
| H01L 21/3213 | (2006.01) |
| H01L 23/528 | (2006.01) |
| H01L 21/033 | (2006.01) |
| H01L 21/311 | (2006.01) |

(52) U.S. Cl.
CPC .... H01L 21/32139 (2013.01); H01L 21/0337 (2013.01); H01L 21/31144 (2013.01); H01L 23/5283 (2013.01); H01L 21/0332 (2013.01)

(58) Field of Classification Search
CPC ............. H01L 21/0332; H01L 21/0337; H01L 21/0338
See application file for complete search history.

(56) References Cited

U.S. PATENT DOCUMENTS

| 8,629,064 | B2 | 1/2014 | Li |
| 9,478,462 | B1 | 10/2016 | Wang |
| 9,607,886 | B1 | 3/2017 | Burns |
| 9,679,809 | B1 | 6/2017 | Kye |
| 9,773,676 | B2 | 9/2017 | Chang |
| 9,818,641 | B1 | 11/2017 | Bouche |
| 10,242,907 | B2 | 3/2019 | Ryckaert |
| 10,340,141 | B2 | 7/2019 | Peng |
| 2013/0105948 | A1* | 5/2013 | Kewley ............... H01L 27/0207 257/618 |
| 2019/0157082 | A1 | 5/2019 | Fan |
| 2019/0318968 | A1 | 10/2019 | Seo |

OTHER PUBLICATIONS

Liu et al., "Litho-Etch-Litho-Etch With Self-Aligned Blocks", U.S. Appl. No. 16/682,494, filed Nov. 13, 2019, 32 Pages.

* cited by examiner

*Primary Examiner* — Walter H Swanson
(74) *Attorney, Agent, or Firm* — Alexander G. Jochym

(57) ABSTRACT

An approach provides a semiconductor structure with a semiconductor layer that has a plurality of metal lines on the semiconductor layer where a first line of the plurality of metal lines on the semiconductor layer has a different line width than a second line of the plurality of metal lines on the semiconductor layer and a low-k dielectric material covers the plurality of metal lines and the semiconductor layer between the plurality of metal lines.

14 Claims, 5 Drawing Sheets

CREATING DIFFERENT WIDTH LINES AND SPACES IN A METAL LAYER

BACKGROUND OF THE INVENTION

The present invention relates generally to the field of semiconductor device manufacture and particularly to forming adjacent metal-lines in a single metal layer that have a different line width and a different space between the adjacent lines using a double patterning process with extreme ultraviolet lithography and subtractive etch processes.

Semiconductor device fabrication is a series of processes used to create integrated circuits present in electronic devices such as computers. As device scaling continues to shrink, in accordance with Moore's Law, it is increasing challenging with current nanoscale semiconductor manufacturing processes to provide both finer lines for increasing wiring requirements and wider lines for electrical performance requirements in a metal layer of a semiconductor device. In order to attain both increased circuit density using lines with smaller width and narrow spaces between lines while meeting required electrical performance targets, it is desirable to have multiple line widths and line spacing in a single metal layer of the semiconductor device. Traditional approaches to provide finer lines in the nanometer realm for semiconductor devices typically involve removing uniform thickness spacers that surround mandrels.

SUMMARY

Embodiments of the present invention disclose a semiconductor structure with a semiconductor layer that has a plurality of metal lines on the semiconductor layer where at least one 1 metal line of the plurality of metal lines on the layer has a different line width than the other metal lines of the plurality of metal lines on the semiconductor layer. A low-k dielectric material covers the plurality of metal lines and the semiconductor layer between the plurality of metal lines.

Embodiments of the present invention provide a method of forming metal lines on a semiconductor layer of a semiconductor structure where a first metal line has a different width than a second metal line on the semiconductor layer. The method includes patterning a plurality of mandrels on a dielectric layer that is over a metal layer on the semiconductor layer and depositing a layer of spacer material over the dielectric layer and the plurality of mandrels. The method includes removing the spacer material from horizontal surfaces of the dielectric layer and the plurality of mandrels. Additionally, the method includes depositing an optical planarization layer over exposed surfaces of the dielectric layer, the plurality of mandrels, and the spacer material remaining on the plurality of mandrels. The method includes patterning the optical planarization layer. Furthermore, the method includes depositing a hardmask material in a plurality of gaps formed during the patterning of the optical planarization layer and removing the remaining optical planarization layer. The method includes performing a spacer pull process to remove the remaining spacer material. The method further includes removing exposed portions of the dielectric layer and the portions of the metal layer under the removed portions of the dielectric layer where one or more metal lines are formed by one or more remaining portions of the metal layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
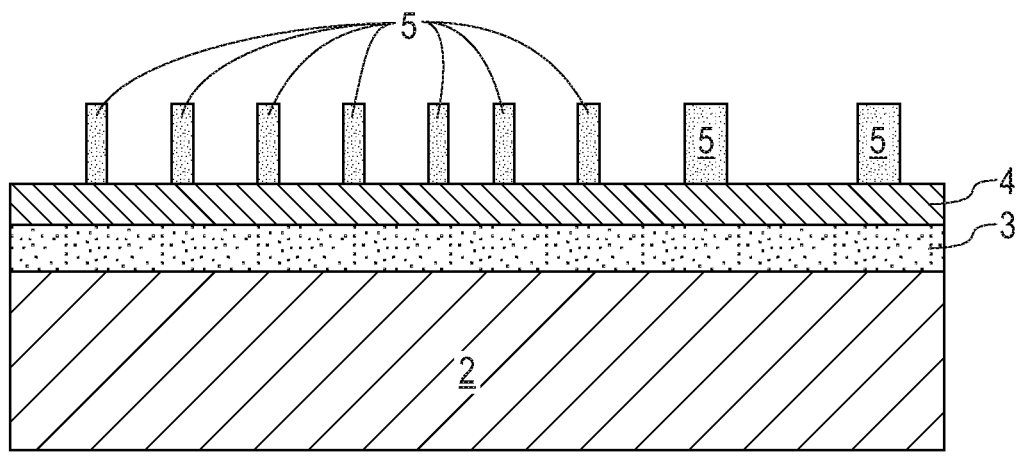
FIG. 1 depicts a cross-sectional view of a semiconductor structure after the patterning of the mandrels, in accordance with an embodiment of the present invention.

Embodiments of the present invention recognize that there is a need for increasing circuit density and increasing electrical performance in semiconductor devices. Embodiments of the present invention recognize that in order to increase circuit density there is a continual need for a reduction in line width and a reduction in the space between adjacent lines. Embodiments of the present invention recognize that to achieve electrical performance objectives, it is desirable to provide wider lines and wider spaces for some circuits. Embodiments of the present invention recognize that a method of providing both narrow lines with close spacing and wider lines with increased spacing between adjacent lines in the same metal layer of a semiconductor device is desirable to provide increased circuit density and improved electrical performance. Embodiments of the present invention recognize that providing semiconductor chip designers with design flexibility that allows the use of both fine lines with small spaces between adjacent lines and wider lines with wider spaces in the same metal layer of a semiconductor device would aide in advanced semiconductor chip design.

Embodiments of the present invention recognize that commonly used methods of attaining fine lines with small spaces between adjacent lines in advanced semiconductor manufacture processes use evenly spaced mandrels and spacers deposited over the mandrels where the mandrels are typically uniform in size and on a uniform pitch. Embodiments of the present invention recognize that the spacers, as deposited, typically provide a uniform thickness on each mandrel resulting in a uniform line width and uniform line spacing when the spacers are removed from the sides of the mandrels to deposit metal lines in the former spacer locations.

Embodiments of the present invention recognize that conventional lithography based multiple patterning processes using mandrels and spacers create metal lines with a same width and a same space. Embodiments of the present invention recognize that current double or multiple patterning processes using evenly spaced mandrels and spacers to form metal lines does not provide an ability to form different width lines or wider metal lines on a layer of the semiconductor structure. Embodiments of the present invention recognize that an ability to provide both fine lines less than ten nanometers and wide lines greater than ten nanometers with different spaces between adjacent metal lines is advantageous for advanced semiconductor design and manufacture.

Embodiments of the present invention provide a method of creating one or more lines that have a different width than an adjacent line in a single metal layer of a semiconductor device. Embodiments of the present invention provide multiple width lines in a single metal layer of a semiconductor device or structure. The method results in creating both very fine lines with less than ten nanometer width next to wider lines with a larger width in a metal layer of a semiconductor device. Similarly, embodiments of the present invention provide a method of forming different spaces between adjacent lines in a single metal layer of the semiconductor device.

Embodiments of the present invention provide semiconductor chip designers flexibility in semiconductor chip design by providing multiple different line widths on a metal layer of the semiconductor device. Embodiments of the present invention provide semiconductor chip designers with the ability to use both wide lines and wide spaces between some adjacent lines and fine lines in a metal layer of a semiconductor device. The ability to use both fine lines and wide lines with either wide spaces or narrow spaces between adjacent lines on the same metal layer allows for the design of high-density circuits with improved electrical performance.

Embodiments of the present invention use a multiple patterning process with extreme ultraviolet lithography, a non-mandrel gap fill process, and customized materials for a spacer pull process to create lines with different widths and different spaces in a metal layer of a semiconductor substructure. The formed metal lines include narrow or fine metal lines and wider metal lines that have a different line pitch or spacing between adjacent lines that cannot be achieved with a single extreme ultraviolet expose step.

Embodiments of the present invention provide a method of performing a mandrel patterning process using extreme ultraviolet lithography and subtractive etch that is followed by an etch back of the spacers to remove horizontal portions of the spacers prior to a deposition of an optical planarization layer over the etched back spacers and mandrels.

The optical planarization layer is selectively patterned using extreme ultraviolet lithography and a second subtractive etch process. A hardmask material is deposited in the gaps formed between adjacent spacers, in the gaps formed between a spacer and an adjacent mandrel, and in the gaps formed within the patterned optical planarization layer. The remaining spacer material is removed. The exposed portions of the dielectric layer under the mandrels and the hardmask material and portions of the underlying metal layer are removed with the exposed portions of the dielectric layer.

Embodiments of the present invention use a directional subtractive etch to remove exposed portions of the dielectric layer and the underlying metal layer that are not covered by the mandrels or the hardmask material. After the removal of the portions of the metal layer, the remaining portions of the metal layer create metal lines that can have more than one width and more than one spacing between adjacent lines. In other words, embodiments of the present invention create a plurality of metal lines where a space between two adjacent metal is not the same for each set of adjacent metal lines. Embodiments of the present invention provide a method with using mandrels, a patterned optical planarization layer, a hardmask material deposited in the gaps created after optical planarization layer patterning and a low density spacer material to achieve lines with different widths and different spaces between adjacent lines in a metal layer of a semiconductor structure.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "positioned on" or "positioned atop" mean that a first element, such as a first structure, is present on a second element, such as a second structure, wherein intervening elements, such as an interface structure may be present between the first element and the second element. The term, "contact," "on top", or "on" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout. The present invention provides a new method and a new structure to achieve metal lines with multiple widths and multiple different spaces between adjacent lines in a single metal layer of a semiconductor structure.

FIG. 1 depicts a cross-sectional view of semiconductor structure 100 after the patterning of mandrels 5, in accordance with an embodiment of the present invention. As depicted, FIG. 1 includes semiconductor layer 2, metal layer 3, dielectric layer 4, and mandrels 5. In FIG. 1, mandrels 5 have multiple widths and multiple different width spaces between adjacent mandrels.

Semiconductor layer 2 is composed of any semiconductor substrate material suitable for a substrate in semiconductor device formation. In various embodiments, semiconductor layer 2 is a silicon semiconductor material. In some embodiments, semiconductor layer 2 is composed of one of any group III-V semiconductor material, group II-VI semiconductor material, or group IV semiconductor material. In other examples, semiconductor layer 2 may be composed of more than one semiconductor materials. For example, semiconductor layer 2 can be a III-V compound semiconductor material (e.g., SiC, GaAs, or InAs), ZnTe, CdTe, ZnCdTe, a II-VI compound semiconductor material, or an alloy of GaAlAs, InGaAs, InAlAs, InAlAsSb, InAlAsP, and InGaAsP. In various embodiments, semiconductor layer 2 is a wafer or a portion of a wafer. In some embodiments, semiconductor layer 2 is one of doped, undoped, or contains doped regions, undoped regions, or defect rich regions. In an embodiment, semiconductor layer 2 is one of a layered semiconductor substrate, such as a semiconductor-on-insulator substrate (SOI), Ge on insulator (GeOI) or silicon-on-replacement insulator (SRI). In various embodiments, semiconductor layer 2 is a semiconductor substrate surface (e.g., a wafer surface) and metal layer 3 is M1. In some embodiments, semiconductor layer 2 is a semiconductor layer above the wafer surface.

Metal layer 3 is on semiconductor layer 2. In various embodiments, metal layer 3 is a metal material that can be etched using a subtractive etch process. For example, metal layer 3 is one of ruthenium (Ru), molybdenum (Mo), tungsten (W), cobalt (Co), or a layer of a work function metal is an oxygen rich p-type work function metal but, is not limited to these materials. A thickness of metal layer 3 can range from five nanometers to one hundred nanometers but, is not limited to these thicknesses. In various embodiments, a subtractive etch of metal layer 3 provides less than five nanometer wide lines and lines having a width of ten nanometers to more than fifty nanometer wide lines formed from metal layer 3. In some embodiments, metal layer 3 is a M1 metal layer, M2 metal layer, or M3 metal layer. In one embodiment, metal layer 3 is deposited on a non-semiconductor layer, such as, a dielectric material layer.

Dielectric layer 4 is over metal layer 3. In various embodiments, layer 4 is a dielectric layer between semiconductor layer 2 and metal layer 3. In an embodiment, dielectric layer 4 is a hydrogenated silicon carbon nitride material however, dielectric layer 4 can be any other dielectric material compatible with the various deposition processes and subtractive etch processes described with respect to FIGS. 1-9.

Mandrels 5 can be formed with any known semiconductor manufacture process for mandrel formation. In various embodiments, a semiconductor material forms mandrels 5. For example, mandrels 5 can be composed of SiN or amorphous Si but, are not limited to these materials. The patterning of mandrels 5 occurs using known semiconductor manufacturing processes. For example, the patterning of mandrels 5 includes photolithography and mandrels etch with known photoresists and processes, such as plasma etch, a wet etch or a combination of both plasma and wet etch processes. In various embodiments, extreme ultraviolet (EUV) lithography is utilized for mandrel patterning. As known to one skilled in the art, EUV lithography is an X-ray technology, which makes use of a high-power laser to create a plasma to emit a short wavelength light inside a vacuum chamber.

In various embodiments, a width of mandrels 5 on semiconductor layer 2 is variable. In other words, not all of mandrels 5 have the same width. As depicted in FIG. 1, a width of some of mandrels 5 is less than a width of the two rightmost mandrels of mandrels 5. A width of mandrels 5 can range from less than ten nanometers to one hundred nanometers but, is not limited to these widths.

In various embodiments, the spacing between mandrels 5 is variable. The space between any two mandrels 5 can be different (e.g., 5 nm, 7 nm, 28 nm, 48 nm space can occur between two adjacent mandrels 5). The space between any two of mandrels 5 can range from seven nanometers to sixty-four nanometers but, is not limited to this range. In an embodiment, the mandrel patterning creates a uniform mandrel width and a uniform space between each of mandrels 5.

FIG. 1 depicts one example of the varying widths and different spacing of mandrels 5. However, in other examples, mandrels 5 may have different widths in different locations. In other embodiments, the location of the thinner and thicker mandrels 5 can be different, the number of different thicknesses of mandrels 5 can be different (e.g., three different mandrel thicknesses can present), and the space between mandrels 5 can be different. In various embodiments, the patterning of mandrels 5 provides one or more different widths of mandrels 5 and one or more different spaces between adjacent mandrels 5. In various embodiments, a semiconductor chip designer's design may place each of mandrels 5 as desired on semiconductor layer 2 assuming the placement, size, and spacing of each of mandrels 5 is within the current manufacturing process limitations of the semiconductor fabrication line manufacturing the semiconductor structure or device.

Figure 2:
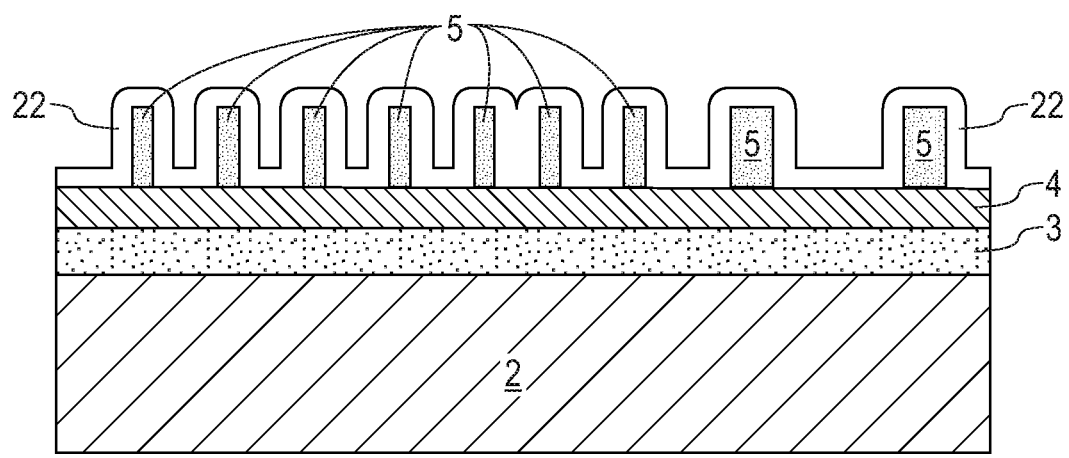
FIG. 2 depicts a cross-sectional view of the semiconductor structure after spacer deposition, in accordance with an embodiment of the present invention.

FIG. 2 depicts a cross-sectional view of semiconductor structure 200 after spacer 22 deposition, in accordance with an embodiment of the present invention. Using known methods of spacer deposition, a layer of spacer 22 is deposited over the exposed surfaces of mandrels 5 and dielectric layer. For example, a conformal deposition using atomic layer deposition (ALD) deposits spacer 22 over the exposed surfaces of mandrels 5 and dielectric layer 4. Thickness of spacer 22 can range from three nanometers to twenty nanometers but, is not limited to these thicknesses.

Spacer 22 may be composed of any known spacer material used in semiconductor device formation. In various embodiments, spacer 22 is composed of a spacer material compatible with a spacer pull process and spacer 22 is a different dielectric material than dielectric layer 4. For example, spacer 22 is composed of a thin metal oxide film or a thin metal nitride film, such as, a titanium nitride (TiN) material, a titanium oxide ($TiO_x$) material, a tantalum oxide ($TaO_x$) material, or a tin oxide ($SnO_x$) material, or the like where x stands for a whole integer, such as, 2, 3, 4, etc.

In various embodiments, the selection of the material for spacer 22 is determined, at least in part, on compatibility with a dry etch process, such as, reactive ion etch (RIE) or a wet etch process used in a spacer pull process to completely remove spacer 22 in later process steps described in detail with reference to FIG. 8. In various embodiments, a selection of a specific material for spacer 22 (e.g., TiO or TiN) and a specific material composition (e.g., TiO or $TiO_2$) is a specific combination tailored for the spacer pull process.

In various embodiments, a deposition of spacer 22 provides a lower density material for spacer 22. Altering the deposition parameters, such as, radio frequency (RF) power or the time in a plasma enhanced ALD process or the reaction ratios, the pressure, and/or the temperature in ALD process during spacer 22 deposition can provide a less dense spacer 22 layer. By changing the deposition parameters for depositing spacer 22, the spacer material in spacer 22 can have a higher organic content (e.g., with more oxygen atoms or more impurities in the spacer material). Using the altered spacer deposition processes provides a less dense spacer material for spacer 22 than the typical or pure metal oxide/nitride without impurities or without additional organic content as deposited with a conventional spacer deposition process (e.g., without increasing the RF power, the time in a plasma, etc.).

In various embodiments, adding organic content or impurities in spacer 22 decreases the density of spacer 22 and improves spacer 22 etch rate with a wet chemical etch process or a dry etch process. In these cases, spacer 22 composition is varied to improve the etch rate during spacer pull (e.g., spacer 22 removal discussed with respect to FIG. 8). For example, increasing the organic content in spacer 22 by changing the composition of spacer 22 from TiO to TiCON provides a better etch rate and better spacer 22 removal in later processes (e.g., spacer pull process discussed with reference to FIG. 8). In some embodiments, increasing the organic content of spacer 22 by ten to twenty percent increases the etch rate during spacer pull. For example, increasing organic content by adding fifteen percent more of an organic material or impurity, such as, carboxyl nitride also reduces spacer 22 density and improves spacer 22 etch rate during spacer pull.

Figure 3:
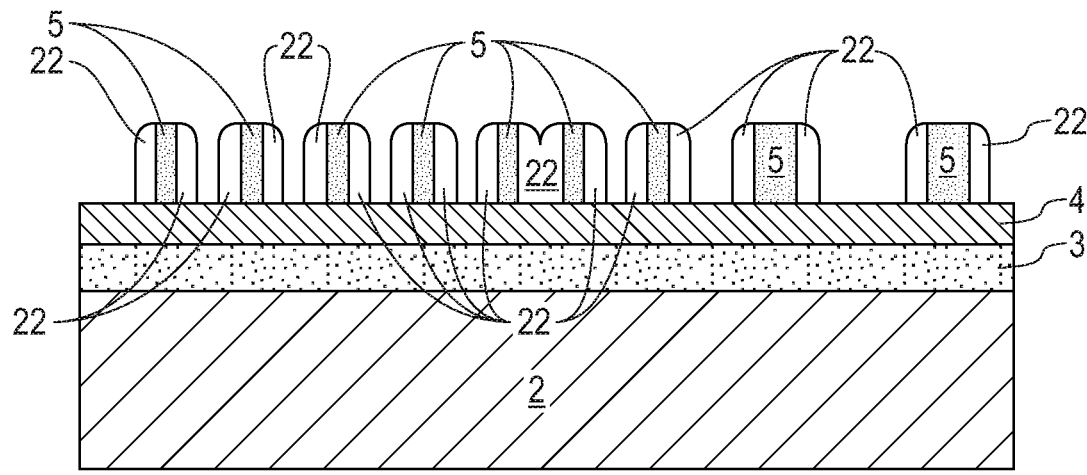
FIG. 3 depicts a cross-sectional view of the semiconductor structure after spacer etch back, in accordance with an embodiment of the present invention.

FIG. 3 depicts a cross-sectional view of semiconductor structure 300 after spacer 22 etch back, in accordance with an embodiment of the present invention. Using known semiconductor processes, spacer 22 is removed from horizontal surfaces of semiconductor structure 300. For example, an anisotrophic etch, using RIE, removes spacer 22 from the top surfaces of mandrels 5 and from the exposed top surfaces of dielectric layer 4 (e.g., removes the portion of dielectric layer 4 not under mandrels 5). Spacer 22 remains on the vertical sides of mandrels 5, as depicted in FIG. 3.

Figure 4:
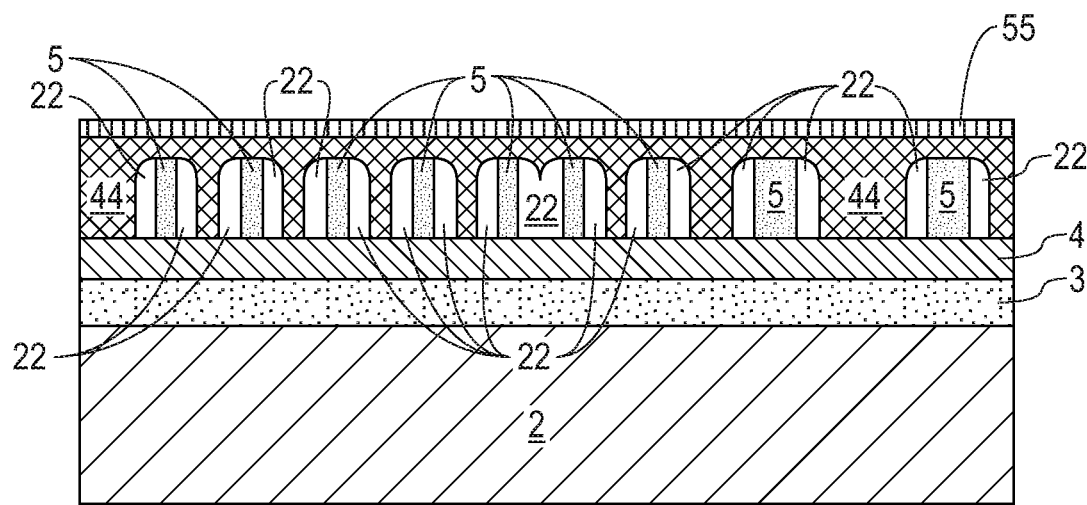
FIG. 4 depicts a cross-sectional view of the semiconductor structure after optical planarization layer (OPL) deposition, in accordance with an embodiment of the present invention.

FIG. 4 depicts a cross-sectional view of semiconductor structure 400 after OPL 44 deposition, in accordance with an embodiment of the present invention. As depicted in FIG. 4, a layer of OPL 44 is deposited on the exposed surfaces of semiconductor structure 400. OPL 44 can be deposited on the exposed surfaces of dielectric layer 4, spacer 22, and mandrels 5 using known methods of OPL deposition (e.g., spin-on-coating). As depicted, OPL 44 covers the top of mandrels 5.

In some embodiments, a thin layer of silicon containing anti-reflective (SiARC) coating or a silicon containing hardmask is deposited over OPL 44. The thin layer of the silicon containing hardmask or SiARC over OPL 44 is depicted in FIG. 4 as anti-reflective coating 55.

Figure 5:
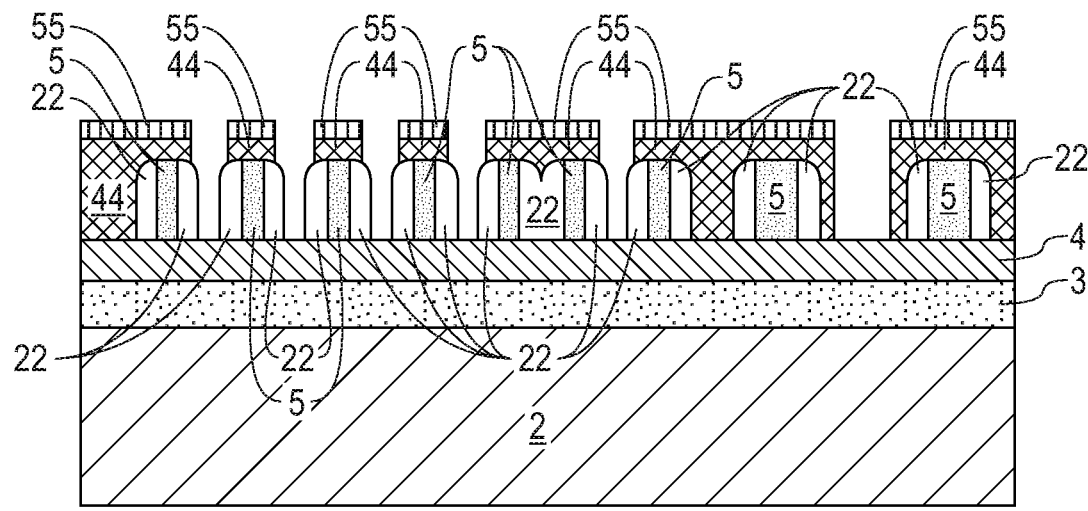
FIG. 5 depicts a cross-sectional view of the semiconductor structure after OPL patterning, in accordance with an embodiment of the present invention.

FIG. 5 depicts a cross-sectional view of semiconductor structure 500 after OPL 44 patterning, in accordance with an embodiment of the present invention. For example, using photolithography, a resist is patterned and a selective subtractive etch of various portions of OPL 44 and anti-reflective coating 55 occurs. In various embodiments, the patterning of OPL 44 and anti-reflective coating 55 occurs using EUV lithography. As depicted in FIG. 5, OPL 44 and anti-reflective coating 55 are selectively removed between some of spacer 22 on mandrels 5.

In some cases, portions of OPL 44 and anti-reflective coating 55 are completely removed between two adjacent spacer 22 that reside on two different mandrels 5. In other cases, some portions of OPL 44 and anti-reflective coating 55 are either not removed between some of adjacent spacer 22 or are partially removed between adjacent spacer 22. The removal of OPL 44 and anti-reflective coating 55 creates gaps in OPL 44 between one or more of two selected adjacent spacer 22 and between two remaining portions of OPL 44 (e.g., remaining portions of OPL 44 that are between two spacer 22 on two adjacent mandrels 5) is depicted in FIG. 5. In some embodiments, a gap is created between one of spacer 22 and a portion of remaining OPL 44 (not depicted in FIG. 5). The selection of how much of OPL 44 and anti-reflective coating 55 to remove and where OPL 44 and anti-reflective coating 55 are removed from is flexible and can be determined, in part, by a semiconductor chip designer. The selection of where to remove OPL 44 determines, at least in part, some of the line widths and/or line spacing in the final semiconductor structure.

Figure 6:
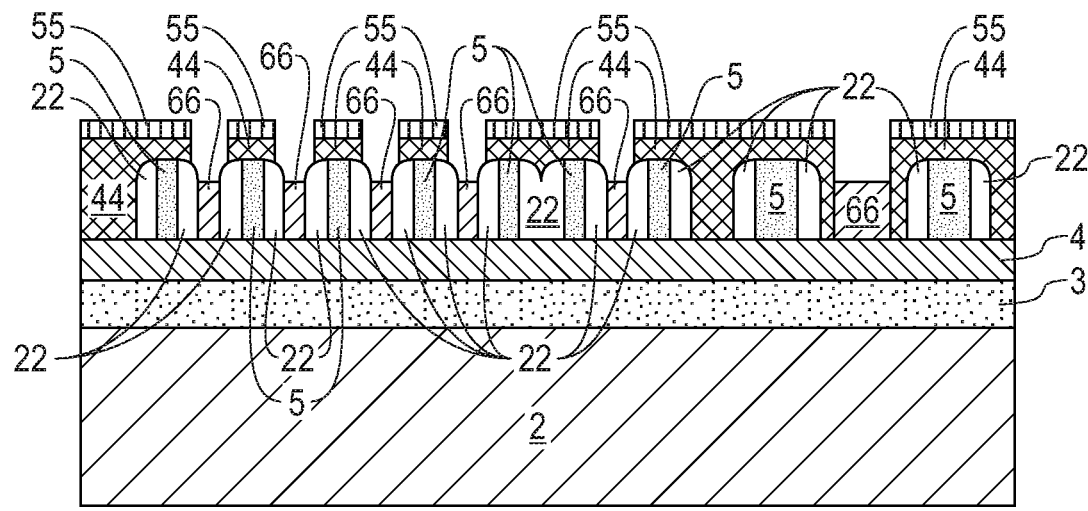
FIG. 6 depicts a cross-sectional view of the semiconductor structure after gap fill on the exposed surfaces of the dielectric layer, in accordance with an embodiment of the present invention.

FIG. 6 depicts a cross-sectional view of semiconductor structure 600 after gap fill on the exposed surfaces of dielectric layer 4, in accordance with an embodiment of the present invention. Hardmask material (HM) 66 can be any hardmask material that can be deposited in the gaps between spacers 22, mandrels 5, and OPL 44 on dielectric layer 4. For example, HM 55 can be a silicon-based material. A spin coat method can be used to apply HM 66 when HM 66 is a spin-on silicon material. HM 66 is not limited to a spin-on silicon material but, may be another material that can be applied to the exposed surface of dielectric layer 4 by the same method or by another deposition method. HM 66 is composed of a material that has one or more of a different etch selectivity, is etched by different etch parameters, or is etched by a different etch process than the etch processes or etch parameters for mandrels 5, spacer 22, OPL 44 and dielectric layer 4.

In various embodiments, a layer of HM 66 is deposited over the exposed surfaces of dielectric layer 4. As depicted in FIG. 6, a layer of HM 66 is deposited on dielectric layer 4 in the gaps created during OPL 44 patterning. As depicted in FIG. 6, the deposition of HM 66 occurs in the gaps that are between two of spacer 22 or between two vertical sides of OPL 44. In other embodiments, HM 66 is deposited between one of spacer 22 and a vertical side of OPL 44. In FIG. 6, a thickness of HM 66 is less than a thickness or height of mandrels 5. The thickness of HM 66 is not limited to this thickness (e.g., HM 66 may be less thick or thicker than depicted in FIG. 6). In an embodiment, the thickness of HM 66 is equal to the height of mandrels 5.

Figure 7:
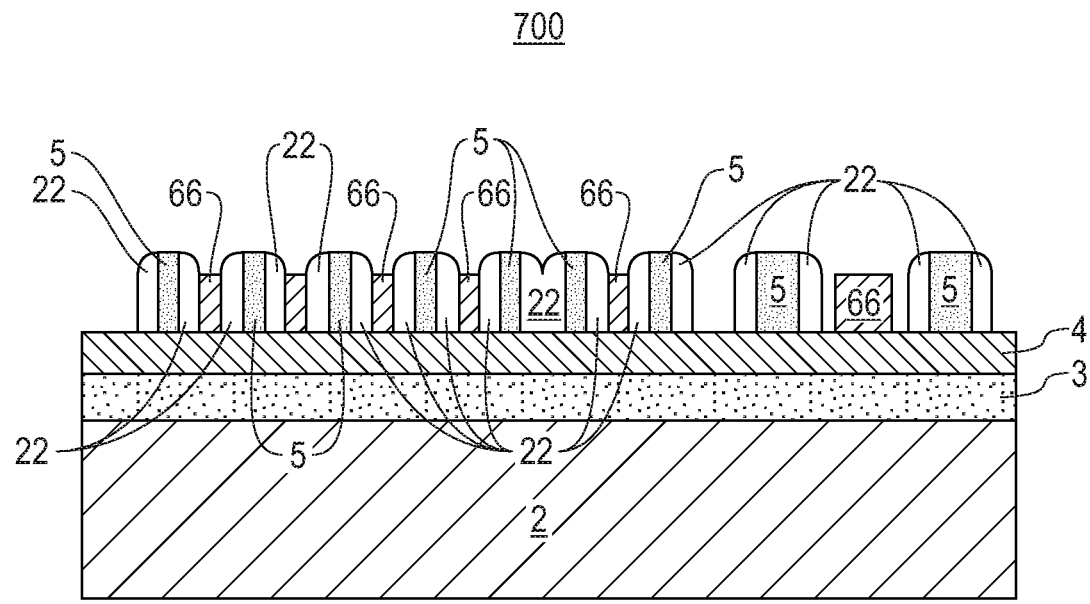
FIG. 7 depicts a cross-sectional view of the semiconductor structure after OPL ash, in accordance with an embodiment of the present invention.

FIG. 7 depicts a cross-sectional view of semiconductor structure 700 after OPL 44 ash, in accordance with an embodiment of the present invention. Using known plasma etch processes, the remaining portions of OPL 44 and anti-reflective coating 55 can be removed. As depicted, portions of anti-reflective coating 55 and OPL 44 are removed from the top surfaces of spacer 22, the top surfaces of mandrels 5, and from some portions of dielectric layer 4. Spacer 22, mandrels 5, and HM 66 remain on portions of dielectric layer 4.

As depicted in FIG. 7, the removal of OPL 44 leaves some portions of dielectric layer 4 exposed between some of spacer 22 and between some of spacer 22 and HM 66. In other examples, the locations of the exposed dielectric layer 4 and how much of dielectric layer 4 is exposed is different (e.g., larger or smaller portions of dielectric layer 4 may be exposed and/or more portions of dielectric layer 4 are exposed).

Figure 8:
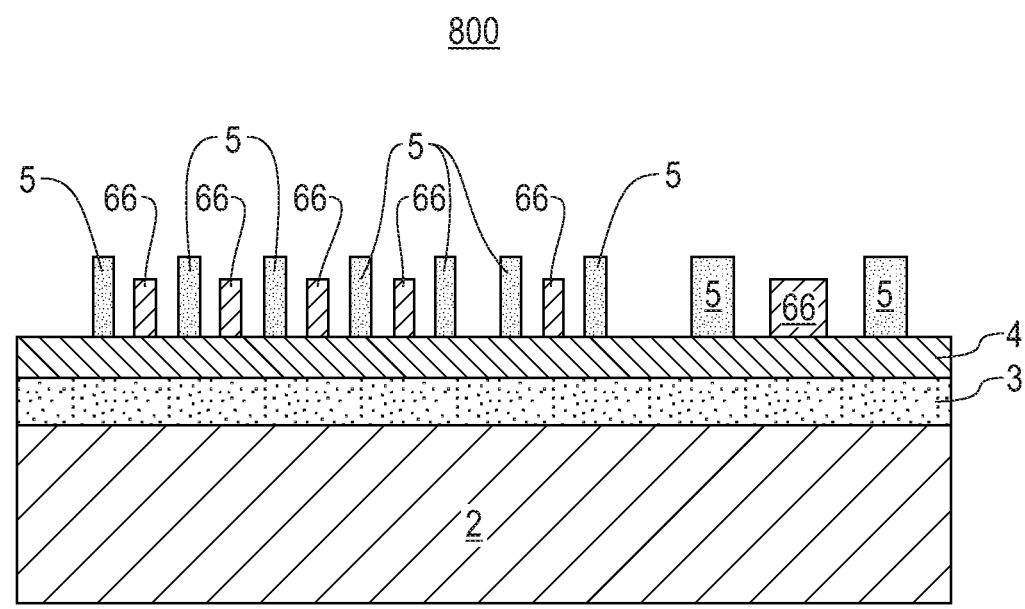
FIG. 8 depicts a cross-sectional view of the semiconductor structure after spacer pull, in accordance with an embodiment of the present invention.

FIG. 8 depicts a cross-sectional view of semiconductor structure 800 after spacer 22 pull, in accordance with an embodiment of the present invention. In various embodiments, spacer 22 is removed in semiconductor structure 800. Spacer pull, as used for the purposes of the present invention, is a method of removing all portions of spacer 22 from the sides of mandrels 5, the sides of HM 66, and the exposed top surfaces of dielectric layer 4 using one or more wet or dry etch processes. As illustrated in FIG. 800, after spacer pull, spacer 22 material is not present on semiconductor structure 800. In various embodiments, a successful spacer pull process occurs due to careful tuning or selection of spacer 22 material and spacer 22 etch processes. For example, a spacer 22 material with 15% organic material and a wet etch process can effectively remove spacer 22 from crevices between mandrels 5 and HM 66. The wet etch process can be done with a dilute hydrofluoric acid or hydroxy peroxide, for example.

As previously discussed, increasing the organic content of spacer 22 provides a less dense spacer 22 that is easier to etch layer. As previously discussed, by one of increasing oxygen content in spacer 22 when spacer 22 is a metal/oxide material or increasing the nitrogen content in spacer 22 when spacer 22 is a metal/nitride material of spacer 22 can improve the etch rate of spacer 22 during spacer pull. In another example, an increase in the organic content of spacer 22 occurs by introducing organic impurities, such as, carboxyl nitride to spacer 22 can increase the etch rate of spacer 22. When a higher organic composition of spacer 22 material occurs the etch rate of spacer 22 increases in a wet etch process or in a dry etch process.

In some embodiments, a dry etch process removes spacer 22. For example, an isotropic etch, such as, a plasma etch process removes spacer 22 from the side of mandrels 5, the side of HM 66, and from the exposed top surface of dielectric layer 4. In other embodiments, a combination of a wet etch process and a dry etch process is used to remove spacer 22 from semiconductor structure 800. After the completion of the one or more etch processes used in the spacer pull, mandrels 5 and HM 66 remain on dielectric layer 4 over metal layer 3 on semiconductor layer 2.

As depicted in FIG. 8, the pitch between mandrels 5 is variable, the width of mandrels 5 is variable, the pitch between the remaining portions of HM 66 is variable, the width of the remaining portions of HM 66 is variable, and the space between various mandrels 5 and various portions of HM 66 is variable. For example, a space between any two features (e.g., between a mandrel and a portion of HM 66 or between two mandrels 5) ranges between five nanometers and fifty nanometers but, is not limited to this range. A width of mandrels 5 and HM 66 ranges between five nanometers and thirty nanometers but, is not limited to this range.

Figure 9:
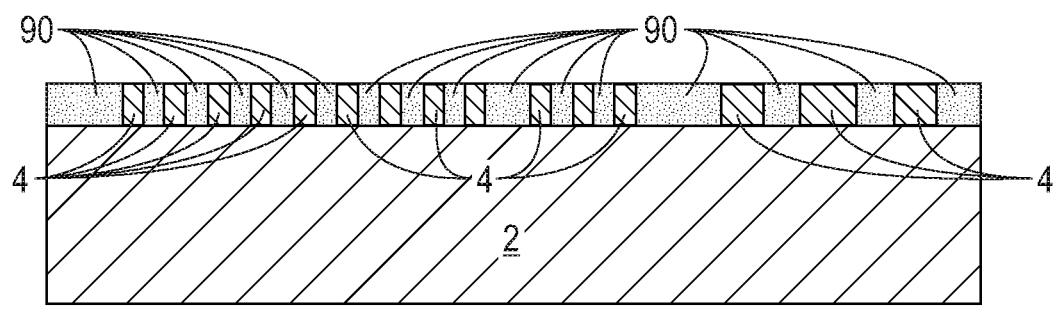
FIG. 9 depicts a cross-sectional view of the semiconductor structure after the selective removal of the metal layer and a deposition of second dielectric material, in accordance with an embodiment of the present invention.

FIG. 9 depicts a cross-sectional view of semiconductor structure 900 after the selective removal of metal layer 3 and a deposition of dielectric 90, in accordance with an embodiment of the present invention. In various embodiments, a subtractive etch of exposed portions of dielectric layer 4 and metal layer 3 occurs. For example, a RIE of exposed horizontal surfaces of dielectric layer 4 and metal layer 3 removes dielectric layer 4 and metal layer 3 from portions of semiconductor layer 2. In some cases, a portion of the horizontal surfaces of mandrels 5 and HM 66 are also removed by the subtractive etch process. In various embodiments, the remaining portions of mandrels 5 and HM 66 can be removed during the subsequent metal etch process. In an embodiment, the remaining mandrels 5 and HM 66 are removed by chemical mechanical planarization (CMP) process. After the completion of the etch process, the portions of metal layer 3 under mandrels 5 and HM 66 remain. The remaining portions of metal layer 3 form the metal conductors or metal lines.

The amount of dielectric layer 4 and metal layer 3 removed and the area of exposed dielectric layer 4 can be determined, at least in part, by one or more of the patterning of mandrels 5, spacers 22, the patterning of OPL 44, and the gap fill of HM 66. The remaining portions of metal layer 3 that were not under mandrels 5 or HM 66 create metal lines with different widths and different spacing between some of the adjacent metal lines. A line created by metal layer 3 has one line width. In this way, as depicted in FIG. 9, when the width of a metal line is determined, at least in part, by a width of HM 66 where the width of HM 66 is variable as depicted in semiconductor structure 800 of FIG. 8 or by a width of each of mandrels 5 where mandrels 5 do not have a uniform width, then the resulting metal lines after the removal of mandrels 5 and HM 66 do not have the same width or the same spacing between the metal lines formed from metal layer 3.

In various embodiments, a width of the resulting metal lines formed from metal layer 3 ranges from five nanometers to thirty nanometers but, is not limited to this range of widths. In various embodiments, the space between adjacent metal lines formed from metal layer 4 ranges between five nanometers and eighty nanometers but, is not limited to this range of spaces. As depicted in FIG. 9, the metal lines formed from metal layer 3 can be of different widths and can have different spacing between two adjacent metal lines. The ability to provide fine metal lines (e.g., less than ten nm) results, at least in part, due to a spacer material selection that is customized to increase spacer 22 etch rates during spacer pull to remove spacer 22 material from the crevices between mandrels 5 and HM 66.

A semiconductor chip designer can determine a number of the portions of dielectric layer 4 exposed, a size or a width of each portion of dielectric layer 4 exposed, and a distribution of the portions of dielectric layer 4 exposed based on the semiconductor manufacturing process limitations, the desired electrical performance, and wiring requirements of the completed semiconductor device or chip.

In various embodiments, using known deposition methods, a deposition of a low-k dielectric material for dielectric 90 occurs on the exposed surfaces of semiconductor layer 2 and the remaining portions of metal layer 3 forming the metal lines on semiconductor layer 2. A low-k dielectric material is typically a material with a dielectric constant below 3.9, in some embodiments of the present invention, dielectric 90 has a dielectric constant of less than 3. Dielectric 90 fills the gaps between the remaining portions of metal layer 3 and covers metal layer 3 and semiconductor layer 2. Typically, the dielectric constant of a dielectric material such as dielectric 90 tends to increase after plasma etch due to plasma damage however, because dielectric 90 is deposited after the plasma metal etch, the dielectric constant of dielectric 90 can remain low.

In various embodiments, a conformal deposition of dielectric 90 occurs using any suitable deposition technique including, but not limited to ALD, chemical vapor deposition (CVD), plasma enhanced chemical vapor deposition (PECVD), physical vapor deposition (PVD), or other similar deposition processes. Dielectric 90 may be composed of any appropriate low-k gate dielectric material, such as but not limited to, SiO2, SiCOH, and SiNCH material. In some embodiments, CMP process occurs to remove a top portion of dielectric 90 that covers the top of metal layer 3.

In some embodiments, after removing the top portion of dielectric 90, for example, by CMP, to expose the top surfaces of the lines formed by the remaining portions of metal layer 3, known semiconductor chip manufacturing processes (e.g., additional wiring layers, via formation, contact formation, etc.) occur to complete the semiconductor chip.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method of forming metal lines on a semiconductor layer of a semiconductor structure, wherein a first metal line has a different width than a second metal line, the method comprising:
    patterning a plurality of mandrels on a dielectric layer that is over a metal layer;
    depositing a layer of spacer material over the dielectric layer and the plurality of mandrels;
    removing the spacer material from horizontal surfaces of the dielectric layer and the plurality of mandrels;
    depositing an optical planarization layer over exposed surfaces of the dielectric layer, the plurality of mandrels, and the spacer material remaining on the plurality of mandrels;
    patterning the optical planarization layer;
    depositing a hardmask material in a plurality of gaps formed during the patterning of the optical planarization layer;
    removing the optical planarization layer remaining after the patterning of the optical planarization layer;
    performing an etch process to remove the spacer material remaining; and
    removing exposed portions of the dielectric layer and portions of the metal layer under the removed exposed portions of the dielectric layer, wherein one or more metal lines are formed by one or more remaining portions of the metal layer.

2. The method of claim 1, further comprising:
    depositing a low-k dielectric material over exposed surfaces of a semiconductor substrate, the plurality of mandrels, the remaining metal layer, and the hardmask material.

3. The method of claim 2, wherein the spacer material includes ten percent to twenty percent organic impurities.

4. The method of claim 2, wherein the spacer material includes an addition of ten percent to twenty percent carboxyl nitride to the spacer material.

5. The method of claim 2, wherein the spacer material includes increasing an oxygen content in the spacer material when the spacer material is a metal/oxide material.

6. The method of claim 5, wherein ten to twenty percent oxygen is added to the metal/oxide spacer material.

7. The method of claim 2, wherein extreme ultraviolet lithography is used to pattern the plurality of mandrels and to pattern the optical planarization layer.

8. The method of claim 2, wherein the hardmask material is a spin-on-silicon material.

9. The method of claim 2, wherein the one or more metal lines have at least one of a first line width or a second line width.

10. The method of claim 2, wherein a space between two adjacent lines of the one or more lines is at least one of a wider space or a thinner space.

11. The method of claim 1, wherein the etch process to remove the spacer material is one of a wet etch process, a reactive ion etch process, or a combination of the wet etch process and the reactive ion etch process.

12. The method of claim 11, wherein the spacer material has a composition that provides a high wet etch rate or a high dry etch rate to remove the spacer material.

13. The method of claim 1, wherein the spacer material is tailored to the etch process removing the spacer material.

14. The method of claim 1, wherein the spacer material is one of a titanium nitride material, a titanium oxide material, a tantalum oxide material, or a tin oxide material.

* * * * *